United States Patent [19]

Macaulay

[11] 4,162,487
[45] Jul. 24, 1979

[54] SYSTEM FOR THE TRANSMISSION AND RECEPTION OF ENCODED INFORMATION

[76] Inventor: Malcolm Macaulay, 34 Jacka Crescent, Campbell, A.C.T., Australia, 2601

[21] Appl. No.: 703,278

[22] Filed: Jul. 7, 1976

[30] Foreign Application Priority Data

Jul. 8, 1975 [AU] Australia .............................. PC2287

[51] Int. Cl.$^2$ .............................................. G06F 3/14
[52] U.S. Cl. ................................ 340/744; 340/365 R; 340/751
[58] Field of Search .......... 178/18; 340/365 R, 324 R, 340/324 A, 324 AD

[56] References Cited

U.S. PATENT DOCUMENTS 3,757,037  9/1973  Bialek ...................................... 178/18

*Primary Examiner*—Marshall M. Curtis

[57] ABSTRACT

A system for the transmission and reception of complex codes which provides a simple means for selection by an operator of the item to be encoded and transmitted. The invention allows the transmitted signal to be decoded and to be shown visually without requiring any assistance from an operator. Standard electrical and electronic components are used in the equipment of the invention. This invention is especially useful for signalling messages in Chinese or Japanese text, which both have a large number of characters and present difficulties in transmission and reception with conventional teleprinter machines.

7 Claims, 2 Drawing Figures

Fig. 2

SYSTEM FOR THE TRANSMISSION AND RECEPTION OF ENCODED INFORMATION

1. Field of the Invention

This invention relates to the transmission and reception of encoded information and more particularly to a method and apparatus for signalling complex codes.

It is desirable, especially in transmitting and receiving information in complex codes such as the Chinese and Japanese native languages, that a simple means be provided to permit operator selection of the item to be encoded and transmitted. In receiving encoded signals it is advantageous that the decoding and visual presentation of the items be performed without operator intervention. The performance of these transmitting and receiving functions is an important feature and object of this invention.

2. Description of the Prior Art

The basic components of a typical telecommunication system capable of transmitting voice, teletypewriter, facsimile, data, or television signals. If digital transmission is employed, signals are first processed in a coder that completely transforms their character. Typically the coder includes filtering and coding circuits that convert the signal into digital form; in data transmission this step is bypassed because the signals are already in digital form.

For analogue transmission, that is, transmission of voice and other signals without converting them to digital form, the coding stage may be omitted. Most modern TV and voice communication use the analogue system; data, teletypewriter, and many other forms of telecommunications use digital techniques.

After coding, the signal is further processed in a so-called modulator, a device for impressing the intelligence signal onto a radio-frequency signal of the proper frequency for the form of transmission to be used. High-frequency signals are usually used for radio transmission; low-frequency signals are used in coaxial cables and other wire lines (described later). The combination of coder and modulator is called the transmitter.

A receiver picks up the transmitted signal at the destination. A demodulator eliminates the carrier wave, and a decoder transforms the message signal into usable form. In many systems the decoder and demodulator are not physically distinguishable but are simply parts of a subsystem that combines both. In two-way communications systems, with a transmitter and receiver at either end, a modulator-demodulator combination, called modem for short, is employed.

SUMMARY OF THE INVENTION

The above and other objects are achieved, according to an aspect of the invention, by means for performing a first encoding designating the group to be encoded, a means for performing a second encoding designating the item within the selected group and means for combining and transmitting the complete signals when signals are to be transmitted. When signals are to be received, the objects are achieved by means to receive and separate the first and second encoded signals, means to decode signals and to select the encoded group, means to select the encoded item within the selected group and means to record and display the item selected.

The present invention thus provides a system whereby complex codes such as the Chinese and Japanese languages may be transmitted and received.

In a preferred embodiment of the invention the first encoding means comprises a keyboard of switches which generate a first code signal. This signal comprises a partial code for subsequent transmission and controls a second group of switches which transfer television-like electrical signals originated by a video signal pattern generator means to a cathode ray tube display screen. An array of items e.g. Chinese characters, is displayed for the operator on the cathode ray tube screen. A light detecting means held in the operator's hand is positioned over the item to be selected. The video signal pattern generator and the cathode ray tube display are synchronised by signals derived from a digital counting register. Operation of a switch associated with the hand-held photodetector causes the digital position coordinate count information of the selected item appearing on the display screen to be transferred to an output register where it is combined with the first code signal arising from operation of the keyboard switches. The composite code thus developed is then transmitted in a form required by the communication circuits. In this particular embodiment of the invention, a reception and decoding of signals is accomplished by using an input register means to assemble and temporarily store the received code signals. Those signals derived from keyboard switch operation by the transmitting operator control a group of switches which transfer television-like electrical signals originated by the code prescribed video signal pattern generator means to a digital storage register when selected item position coordinate code coincidence is realised. A second cathode ray tube display means operating in synchronism with the video signal pattern generator is employed to display the selected code, the display being made by reading the video information from the digital storage register at the time when desired display position coordinate count occurs. The image displayed on the second cathode ray tube is recorded by photographic means for subsequent reading. All said components may be arranged within a cabinet of dimension and shape not unlike that employed for housing conventional electro-mechanical communication terminals used for transmitting and receiving information in English and other phonetic letter language.

DETAILED DESCRIPTION

A preferred form of the invention is illustrated and described with reference to the accompanying drawings. It is emphasised that the drawings and description are not limitative of this invention. In the drawings:

FIG. 2 is an example of the image displayed on the first cathode ray tube screen when encoding information for transmission into characters.

Figure 1:
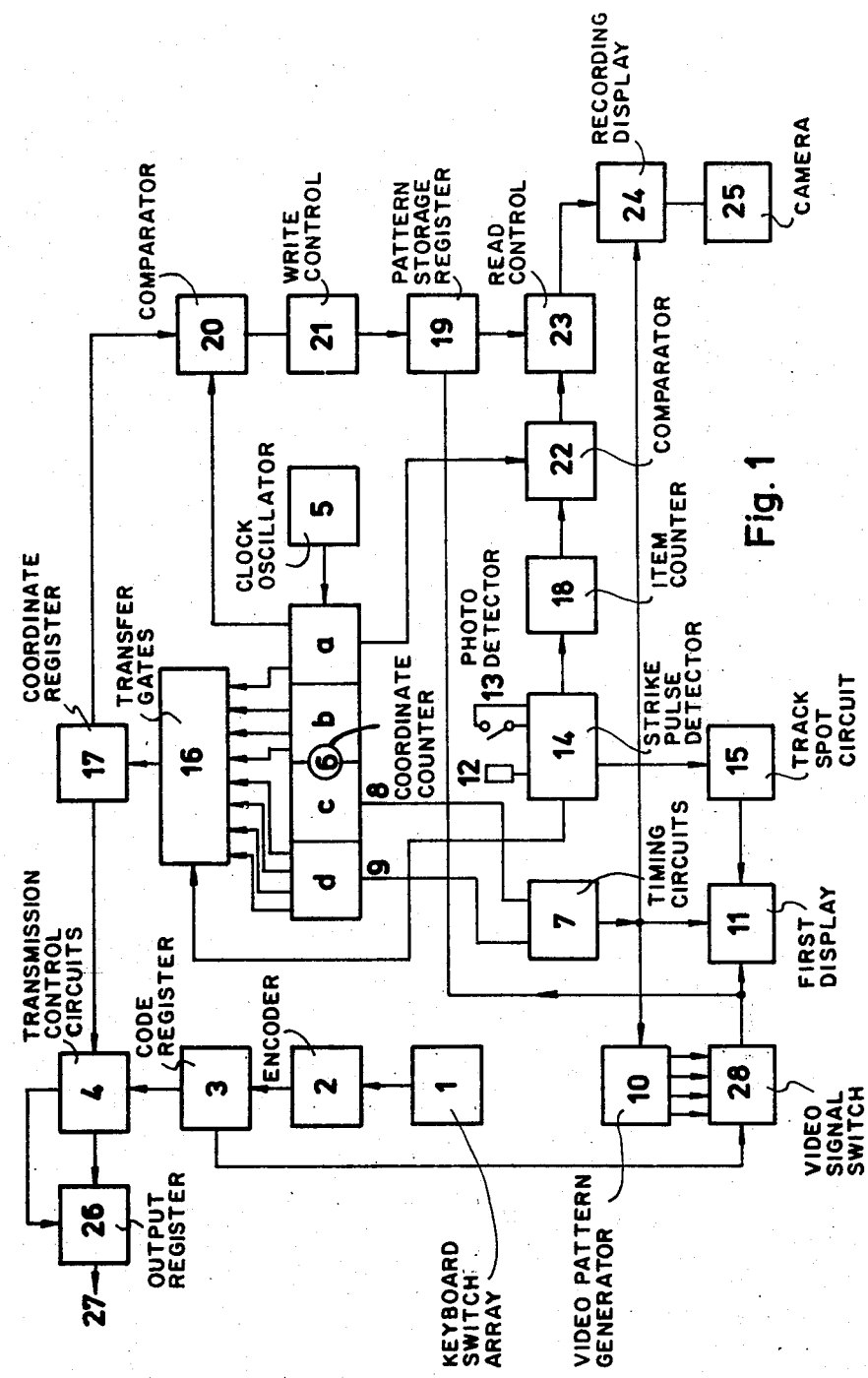
FIG. 1 is a schematic, block diagram of the present invention.

The following description of the operation of the invention makes reference to the schematic block diagram, FIG. 1.

Operation is initiated when the operator depresses a switch of the keyboard switch array (1). This action causes an appropriate code signal to be generated by the keyboard encoder (2) in a manner well known in the art. By way of example, a six bit parallel code is thus developed, unique to the key depressed. The code generated by the keyswitch closure is stored in a keyboard code register (3). The code remains in the keyboard code register until such time as it is required for transmission to the output register or until the operator depresses a different keyswitch of the keyboard switch array (1).

Figure 2:
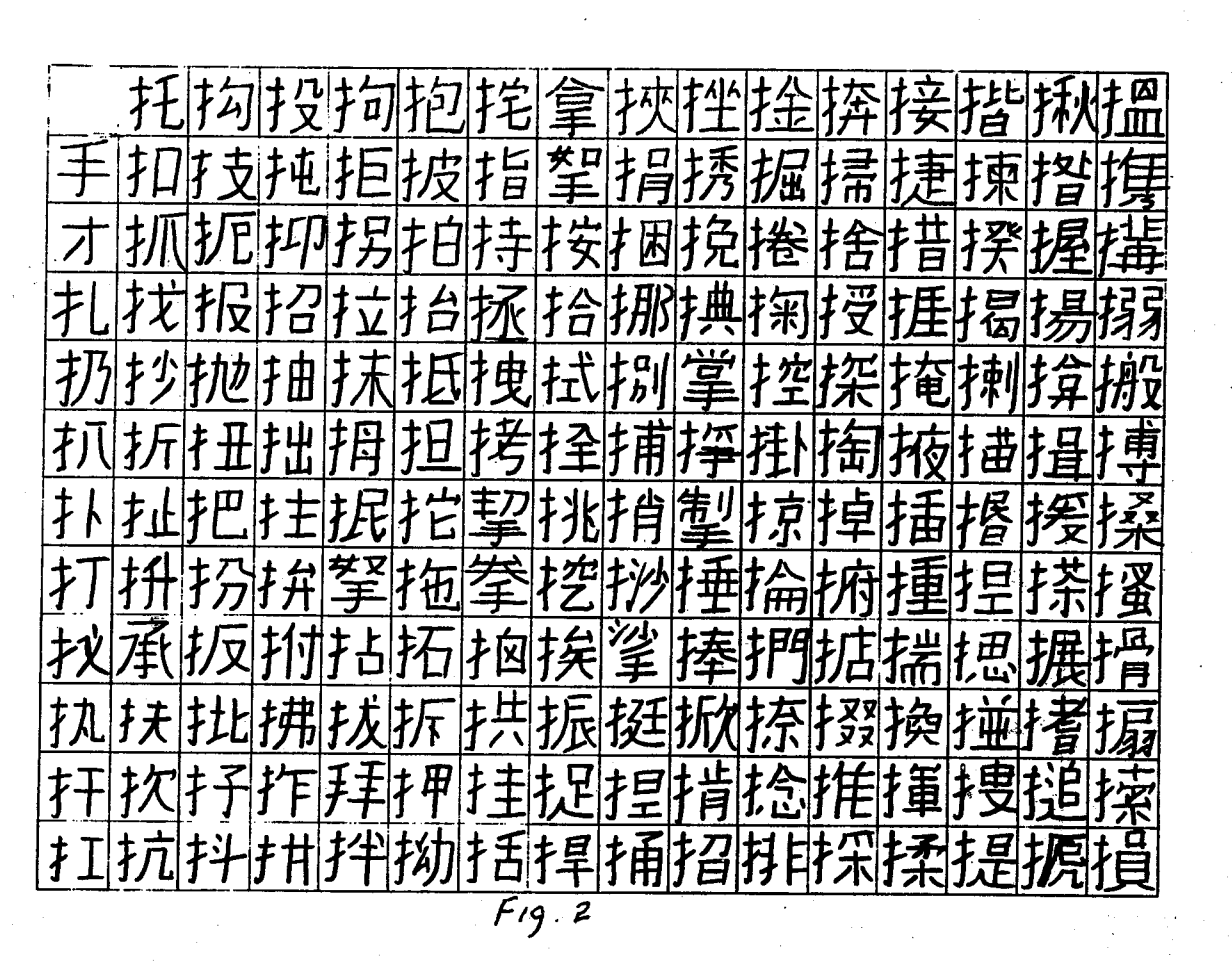

A master clock oscillator (5) establishes the timing of occurrence of events within the digital electronic circuits of the apparatus. The master clock oscillator (5) comprises a crystal controlled oscillator of conventional design operating at a frequency of 10 megahertz. Coordinate counter (6) continuously scales the frequency of the signals generated by the master clock oscillator (5). In the illustration, the coordinate counter consists of a counting register (6a) operating on a scale of 64 followed by a counting register (6b) operating on a scale of 10 which is followed by a counting register (6c) operating on a scale of 32 which is followed by a counting register (6d) operating on a scale of 13. Thus the frequency of the 10 megahertz master clock oscillator (5) is divided successively by 64, 10, 32 and 13, giving frequencies of 156,250 Hertz, 15,625 Hertz, 488.28125 Hertz and 37.560096153 Hertz respectively. The total effect thus, is to divide the master clock oscillator (5) frequency by 266,240. As will be readily understood, signals may be provided at all intermediate stages at frequencies determined by the point within the scaling counter elements at which they are taken. Two of the signals taken from appropriate points in the coordinate counter (6), specifically one occurring at a frequency of 15,625 Hertz and one occurring at a frequency of 37.56 Hertz are used in timing circuits (7) to generate horizontal and vertical synchronising pulses as is well known in the electronic television art. The signal shown being carried by conductor (8) is generated when binary counter (6a) indicates a count of 64 and decimal counter 6b) indicates a count of 8. As may be understood, these counting elements in combination signify that a count of 512 pulses from the master clock (5) has occurred. In like fashion, the signal shown being carried by conductor (9) is generated when counter (6d) indicates a count of 12. The event signal on the conductor (8) indicates the termination of an active line display in television parlance. The event signal on the conductor (9) indicates the termination of active field display. Having thus developed signals determining the initial timing of display events on a television screen, it can be readily understood that other counting elements of coordinate counter (6) can be used to identify the position of items displayed on a television screen so synchronised. FIG. 2 which depicts the image of a number of (Chinese-like) characters displayed on a television display so synchronised, presents the characters in an array having 16 vertical columns and 12 horizontal rows, 192 character delineation positions, or areas, in all. As illustrated, the highest order bit of binary counting register (6a) in combination with the three lowest order bits of decimal counting register 86b) define the column number, reading from left to right of FIG. 2, isomorphically. In like fashion, the counting bits of the register (6d) number and define the row position of the character item being displayed at that particular moment.

A video pattern generator (10) synchronised by the horizontal and vertical synchronising signals described earlier causes a television picture to be displayed on the first display (11). In the embodiment of the invention such display may take the form shown in FIG. 2. The video signal pattern generator (10) has sufficient capacity to provide simultaneously video signals representing one or more of the character arrays illustrated and typified in FIG. 2. The video signal switch (28) closes an appropriate circuit to direct a particular signal from video signal pattern generator (10) to the display (11). The fundamentals of such direction are obvious to one with ordinary skill in the digital electronics art and have been adverted to and explained previously in conjunction with the explanation of the operation of the keyboard switch array (1), the keyboard encoder (2) and the keyboard code register (3). By the means thus described, it is evident that an array of items such as Chinese native language characters, may be presented for visual observation to an operator whilst electronic circuits track the process and both control and measure the physical position of the displayed items, the instantaneous position of each item on the display being isomorphically associated with the instantaneous measure of time derived from counting pulses from the master clock.

An operator, seated at the operating position of the apparatus causes the selection of a group of characters or like items to appear on the display screen (11) by pressing a switch on the keyboard switch array (1). To select the specific item with the group for subsequent transmission, the operator is provided with a photodetector (12) and a switch (13). In the present embodiment of the invention, the photodetector is a small phototransistor and the switch is a small, magnetically actuated reed switch of the type commonly used in keyboard switch arrays. The phototransistor (12) and the switch (13) are mounted in a housing in such a manner as to have the appearance of a writing instrument such as a pen or pencil, the photodetector being placed at the tip and the switch mounted behind the photodetector. By placing the photodetector (12) against the cathode ray tube display screen (11) the operator signals and selects the specific character desired.

As the electron beam traverses the display (11) light from the cathode ray tube phosphor falls on the photodetector (12) and an electrical signal is generated. This signal is amplified and selected by circuits within strike pulse selector (14). Amplification is performed by conventional circuits. As is well known and readily understood, the photodetector will detect the light and generate electrical pulses for several transits of the electron beam. Since one and only one signal is required, a counting circuit within strike pulse selector (14) responds only to the fourth pulse received thus rejecting light signals of prior or subsequent occurrence. A more complete explanation of the operation of the photodetector and strike pulse circuits may be found in Australian Pat. No. 415409 and U.S. Pat. No. 3,569,617.

The selected strike pulse is shaped into a pulse of proper amplitude and length by the track spot circuit (15) for display indication on display (11) thereby indicating to the operator that the photodetector is in the proper position to select the desired character. By pressing the photodetector and switch assembly against the display screen, switch (13) is closed by the operator permitting the strike pulse to pass to transfer gates (16). Transfer gates (16) convey the column and row coordinate data from coordinate counter (6) to coordinate register (17) for temporary storage and subsequent transfer to output register (26).

This completes the description of the item selection and encoding process.

In order to provide a permanent record of the codes selected by the operator whilst placing them in proper sequence for reading, further circuits and means are provided. Item counter (18) is a counter modulo 16 and a counter modulo 12 in series. The lifting of the photodetector assembly from the display is detected when switch (13) is deactuated. The signal thus developed advances the count stored in the item counter (18). As is apparent to those skilled in the art, the modulo 16 counter describes the column position of the item to be recorded and the modulo 12 counter describes the row position of the item to be recorded. Video signal information after passing through video signal switch (28) is presented to display (11) as previously described and to video signal pattern storage register (19). Video signal pattern storage register (19) has the capacity to store 1024 bits of information, the number used in the present embodiment of the invention to delineate a character. Comparator (20) has two input signals. The first is the coordinate information relating to the specific character selected which is held in coordinate register (17) as described earlier. The second input is from appropriate elements within coordinate register (6). At those times when the coordinate data of the selected character and the condition of the coordinate register (6) are in coincidence, comparator (20) actuates write control (21) causes the video signal pattern register (19). In like fashion, comparator (22) has two inputs, the first from the item counter (18) described earlier and the second from the appropriate elements within coordinate register (6) aforementioned. When coincidence is obtained between the data coordinates stored in the item counter (18) and the coordinate register (6) prevails, read control (23) is actuated by comparator (22) causing the item selected to be presented on recording display (24). As may be appreciated, recording display (24) is operated in synchronism with video signal pattern generator (10) and display (11) by horizontal and vertical synchronising signals from timing circuits (7). By these means it is clear to one skilled in the art that the selected character video information is presented to recording display (24) in proper form and position for recording and reading. A permanent record of the items selected is provided by camera (25) which captures the image appearing on recording display (24) film.

Transmission control circuits (4) may take whatever form is required to control the speed of transmission of the complete code signals to output register (26) and thence to output line (27). A variety of signalling means may be used as is well known in the art. The appropriate method and apparatus being selected to match the characteristics and nature of the output lines and transmission medium.

Although this description and schematic diagram relate only to the use of the apparatus for selecting, encoding, recording and transmitting information it is apparent to one with ordinary skill in the art that reception, decoding and recording of information can be accomplished readily by employing a subset of the components heretofore described, altering the inputs and outputs of said components by switching so that input codes select the appropriate video signal pattern to cause ultimately the display of the selected item on recording display (24) and thus on film placed in camera (25).

It is reiterated that the present invention is not confined to the transmission and reception of native Chinese characters. Other applications and modifications of the invention will be apparent to those skilled in the art.

What I claim is:

1. A system for the transmission and reception of selected information comprising
   keyboard means for performing a first encoding step of designating for display a group of information selected from the total information and generating an associated first code signal,
   means for displaying said designated group of information,
   photodetector means associated with said display,
   means for performing a second encoding step designating an item within said selected group and means for generating a second code signal, representative of said designated item,
   means for combining both said signals to give a combined signal,
   means for transmitting said combined signal in association with said means for receiving said combined signal,
   means for separating said combined signal into said first and said second code signal,
   means for decoding said first code signal to designate a particular character generator corresponding to the selected encoded group,
   decoder means responsive to said second code signal to select the encoded item within the selected group, and
   means responsive to said designated character generator to record and to display the selected item.

2. A system as claimed in claim 4 comprising a video signal pattern generator means for generating television-like electrical signals, and a second group of switches for controlling the transfer of the signals of said video signal pattern generator means to a cathode display screen, said first code signal comprising a partial code for subsequent transmission and for controlling said second group of switches.

3. A system as claimed in claim 2 comprising a digital counting register for generating signals for synchronising said video signal pattern generator means, and said cathode ray tube display.

4. A system as claimed in claim 1 wherein the first encoding means comprises a keyboard of switches for generating a first code signal.

5. A system as claimed in claim 3 a light detecting means positioned over the item to be selected.

6. A system as claimed in claim 5 comprising a switch associated with said light detecting means for causing the digital position coordinate count of the selected item to appear on a display screen and an output register for receiving said digital position coordinate count from said switch and for combining it with the first code signal arising from operation of the keyboard switches to develop a composite code for transmission.

7. A system as claimed in claim 6 comprising an input register means connected ahead of said output register for receiving and decoding incoming signals so as to assemble and temporarily store the received code signals.

* * * * *